United States Patent
Matsueda et al.

(10) Patent No.: US 11,563,123 B2
(45) Date of Patent: Jan. 24, 2023

(54) DISPLAY DEVICE

(71) Applicants: Tianma Japan, Ltd., Kanagawa (JP); Wuhan Tianma Micro-Electronics Co., Ltd., Wuhan (CN)

(72) Inventors: Yojiro Matsueda, Kanagawa (JP); Genshiro Kawachi, Kanagawa (JP)

(73) Assignees: TIANMA JAPAN, LTD., Kanagawa (JP); Wuhan Tianma Micro-Electronics Co., Ltd., Wuhan (CN)

( * ) Notice: Subject to any disclaimer, the term of this patent is extended or adjusted under 35 U.S.C. 154(b) by 63 days.

(21) Appl. No.: 17/123,191

(22) Filed: Dec. 16, 2020

(65) Prior Publication Data

US 2021/0202753 A1 Jul. 1, 2021

(30) Foreign Application Priority Data

Dec. 26, 2019 (JP) .............................. JP2019-236647
Jun. 26, 2020 (JP) .............................. JP2020-110292

(51) Int. Cl.
*H01L 29/786* (2006.01)
*H01L 51/52* (2006.01)
(Continued)

(52) U.S. Cl.
CPC .... *H01L 29/78675* (2013.01); *H01L 27/3244* (2013.01); *H01L 29/7869* (2013.01);
(Continued)

(58) Field of Classification Search
CPC .......... H01L 29/78675; H01L 27/3244; H01L 29/7869; H01L 51/5218; H01L 51/56; H01L 2227/323
(Continued)

(56) References Cited

U.S. PATENT DOCUMENTS

2011/0193067 A1* 8/2011 Lee ..................... H01L 51/5256
257/E51.025
2013/0140547 A1* 6/2013 Lee ..................... H01L 51/5256
438/46
(Continued)

FOREIGN PATENT DOCUMENTS

JP    2017-216323 A   12/2017
JP    2018-006671 A    1/2018

OTHER PUBLICATIONS

Tomoatsu Kinoshita, et al., "Requirement of a Polyimide Substrate to Achieve High Thin-film-transistor Reliability", SID (Society for Information Display), International Symposium Digest of Technical Papers, May 2018, p. 888, vol. 49, issue 1.

*Primary Examiner* — Dzung Tran
(74) *Attorney, Agent, or Firm* — Sughrue Mion, PLLC

(57) ABSTRACT

A display device includes a first polyimide layer, a first silicon oxide layer located above and in direct contact with the first polyimide layer, an amorphous silicon layer located above and in direct contact with the first silicon oxide layer, a second polyimide layer located above and in direct contact with the amorphous silicon layer, a plurality of light-emitting elements located above the second polyimide layer, a transistor array located above the second polyimide layer, the transistor array being configured to control light emission of the plurality of light-emitting elements, a transparent conductive layer located between the transistor array and the second polyimide layer, and a second silicon oxide layer located between and in direct contact with the transparent conductive layer and the second polyimide layer.

10 Claims, 7 Drawing Sheets

(51) Int. Cl.
  *H01L 51/56* (2006.01)
  *H01L 27/32* (2006.01)
(52) U.S. Cl.
  CPC .......... *H01L 51/5218* (2013.01); *H01L 51/56* (2013.01); *H01L 2227/323* (2013.01); *H01L 2251/308* (2013.01)
(58) Field of Classification Search
  USPC .......................................................... 257/40
  See application file for complete search history.

(56) References Cited

U.S. PATENT DOCUMENTS

| | | | | |
|---|---|---|---|---|
| 2015/0102324 A1* | 4/2015 | Lee | ..................... | H01L 51/0097 257/40 |
| 2015/0123098 A1* | 5/2015 | Kang | .................. | H01L 27/3244 438/151 |
| 2016/0197129 A1* | 7/2016 | Kang | .................. | H01L 51/5253 257/40 |
| 2017/0346027 A1 | 11/2017 | Ishiyama et al. | | |
| 2019/0081090 A1* | 3/2019 | Lee | ..................... | H01L 27/1218 |

\* cited by examiner

DISPLAY DEVICE

CROSS-REFERENCE TO RELATED APPLICATIONS

This non-provisional application claims priority under 35 U.S.C. § 119(a) on Patent Application No. 2019-236647 filed in Japan on Dec. 26, 2019 and Patent Application No. 2020-110292 filed in Japan on Jun. 26, 2020, the entire contents of which are hereby incorporated by reference.

BACKGROUND

This disclosure relates to a display device. An organic light-emitting diode (OLED) element is a current-driven self-light-emitting element and therefore, eliminates the necessity of backlight. In addition to this, the OLED element has advantages for achievement of low power consumption, wide viewing angle, and high contrast ratio. Because of no backlight, a flexible OLED display device including organic EL devices attains ultra-slimness and flexibility.

The substrate of a traditional flexible OLED display device has a structure in which a silicon oxide layer, a silicon nitride layer, and another silicon oxide layer are stacked one above another on a polyimide film having a thickness of 10 um to 15 um. A thin-film transistor (TFT) array is fabricated on the substrate.

SUMMARY

An aspect of this disclosure is a display device including: a first polyimide layer; a first silicon oxide layer located above and in direct contact with the first polyimide layer; an amorphous silicon layer located above and in direct contact with the first silicon oxide layer; a second polyimide layer located above and in direct contact with the amorphous silicon layer; a plurality of light-emitting elements located above the second polyimide layer; a transistor array located above the second polyimide layer, the transistor array being configured to control light emission of the plurality of light-emitting elements; a transparent conductive layer located between the transistor array and the second polyimide layer; and a second silicon oxide layer located between and in direct contact with the transparent conductive layer and the second polyimide layer.

Another aspect of this disclosure is a method of manufacturing a display device, the method including: a first step of forming a first silicon oxide layer directly on a first polyimide layer; a second step of forming an amorphous silicon layer directly on the first silicon oxide layer; a third step of forming a second polyimide layer directly on the amorphous silicon layer; a fourth step of forming a second silicon oxide layer directly on the second polyimide layer; a fifth step of forming a transparent conductive layer directly on the second silicon oxide layer; and a sixth step of forming a transistor array on the second silicon oxide layer, the transistor array being to control light emission of a plurality of light-emitting elements.

It is to be understood that both the foregoing general description and the following detailed description are exemplary and explanatory and are not restrictive of this disclosure.

EMBODIMENTS

Figure 1:
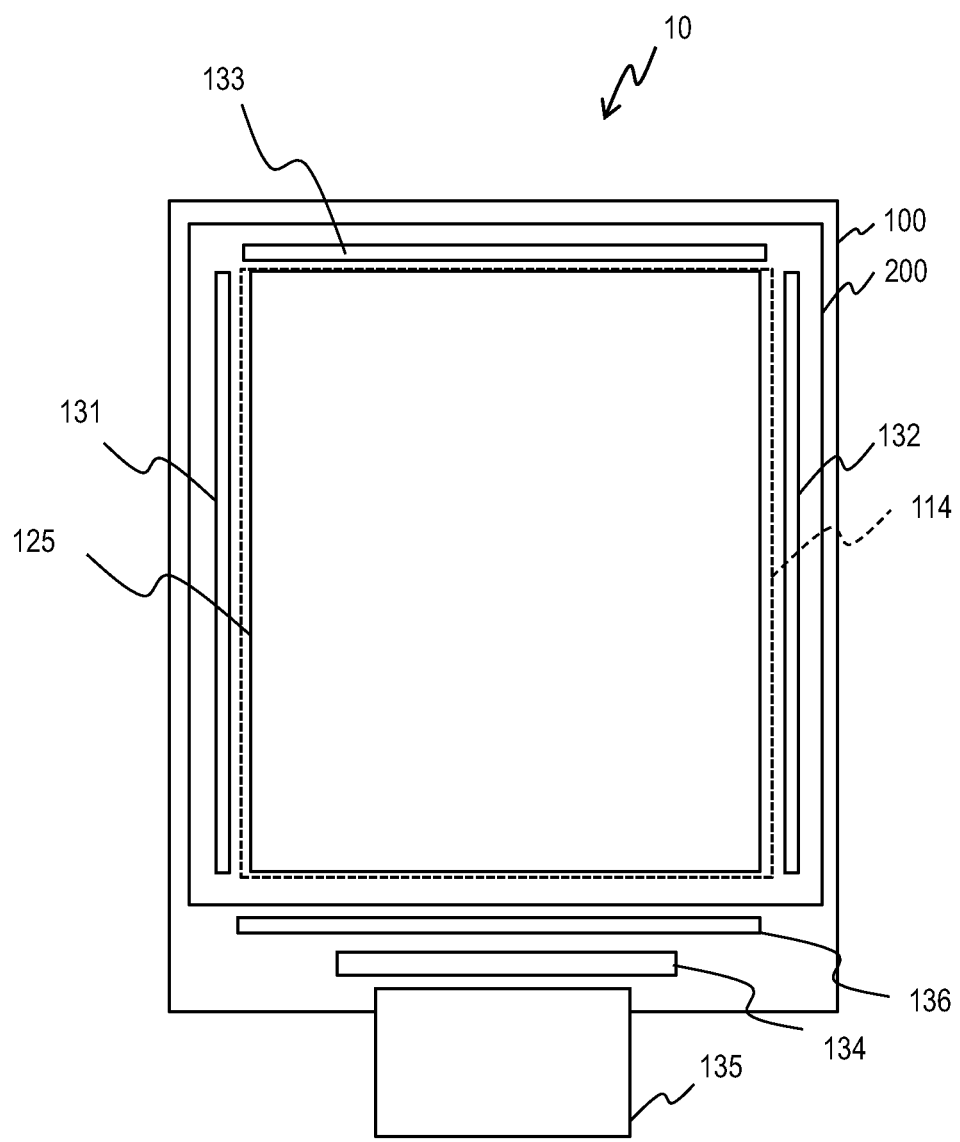
FIG. 1 schematically illustrates a configuration example of an OLED display device.

Hereinafter, an embodiment of this disclosure will be described with reference to the accompanying drawings. It should be noted that the embodiment is merely an example to implement this disclosure and is not to limit the technical scope of this disclosure. Elements common to the drawings are denoted by the same reference signs and each element in the drawings may be exaggerated in size and/or shape for clear understanding of the description.

The organic light-emitting diode (OLED) display device disclosed herein includes a transparent conductive layer between the polyimide layer and the thin-film transistor (TFT) array. The transparent conductive layer reduces the effect of the electric field generated by the charges in the polyimide layer on the characteristics of the TFTs and suppresses image retention. The transparent conductive layer does not need to be patterned, which does not affect the alignment in the subsequent manufacturing process.

The OLED display device disclosed herein further includes an adhesion enhancement layer between the transparent conductive layer and the polyimide layer. The adhesion enhancement layer prevents the transparent conductive layer from detaching from the polyimide layer. The features of this embodiment are applicable to self-light-emitting display devices other than the OLED display device.

Overall Configuration

FIG. 1 schematically illustrates a configuration example of an OLED display device 10. The OLED display device 10 includes a thin-film transistor (TFT) substrate 100 on which OLED elements (light-emitting elements) are formed and a structural encapsulation unit 200 for encapsulating the OLED elements. In the periphery of a cathode electrode region 114 outer than the display region 125 of the TFT substrate 100, a scanning driver 131, an emission driver 132, a protection circuit 133, a driver IC 134, and a demultiplexer 136 are provided.

The driver IC 134 is connected to the external devices via flexible printed circuits (FPC) 135. The scanning driver 131 drives scanning lines on the TFT substrate 100. The emission driver 132 drives emission control lines to control light emission of individual pixels. The protection circuit 133 protects the elements on the TFT substrate from electrostatic discharge. The driver IC 134 is mounted with an anisotropic conductive film (ACF), for example.

The driver IC 134 provides power and timing signals (control signals) to the scanning driver 131 and the emission driver 132 and further, provides power and a data signal to the demultiplexer 136.

The demultiplexer 136 serially outputs output of one pin of the driver IC 134 to d data lines (d is an integer more than 1). The demultiplexer 136 changes the output data line for the data signal from the driver IC 134 $d$ times per scanning period to drive d times as many data lines as output pins of the driver IC 134.

Circuit Configuration

Figure 2A:
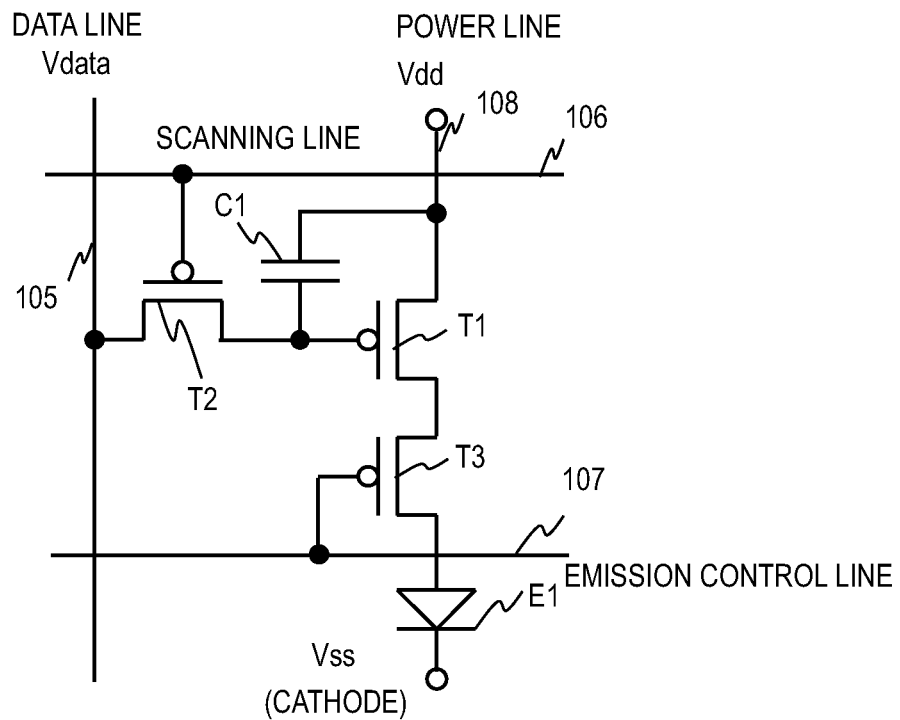
FIG. 2A illustrates a configuration example of a pixel circuit.

A plurality of pixel circuits are formed on the TFT substrate 100 to control electric current to be supplied to the anode electrodes of subpixels. FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the subpixel. The selection transistor T2 is a p-channel TFT and its gate terminal is connected with a scanning line 106. The source terminal is connected with a data line 105. The drain terminal is connected with the gate terminal of the driving transistor T1.

The driving transistor T1 is a transistor (driving TFT) for driving the OLED element E1. The driving transistor T1 is a p-channel TFT and its gate terminal is connected with the drain terminal of the selection transistor T2. The source terminal of the driving transistor T1 is connected with a power line (Vdd) 108. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the transistor T3.

Figure 2B:
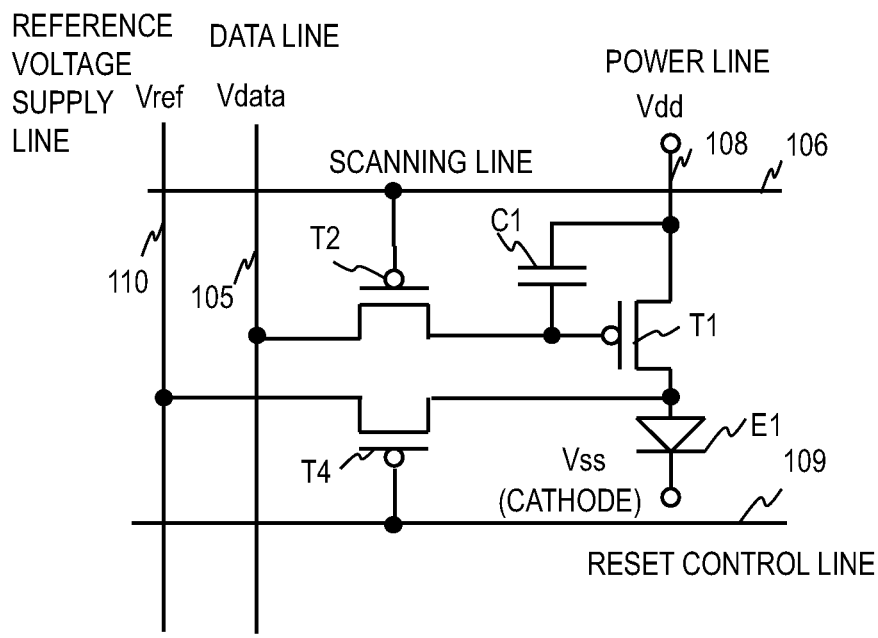
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 controls the electric connection between a reference voltage supply line 110 and the anode of the OLED element E1. This control is performed in accordance with a reset control signal supplied to the gate of the reset transistor T4 through a reset control line 109.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The reset transistor T4 can also be used to measure a characteristic of the driving transistor T1. For example, the voltage-current characteristic of the driving transistor T1 can be accurately measured by measuring the current flowing from the power line (Vdd) 108 to the reference voltage supply line (Vref) 110 under the bias conditions selected so that the driving transistor T1 will operate in the saturated region and the reset transistor T4 will operate in the linear region. If the differences in voltage-current characteristic among the driving transistors T1 for individual subpixels are compensated for by generating data signals at an external circuit, a highly-uniform display image can be attained.

In the meanwhile, the voltage-current characteristic of the OLED element E1 can be accurately measured by applying a voltage to light the OLED element E1 from the reference voltage supply line 110 when the driving transistor T1 is off and the reset transistor T4 is operating in the linear region. In the case where the OLED element E1 is deteriorated because of long-term use, for example, if the deterioration is compensated for by generating a data signal at an external circuit, the display device can have a long life spun. The circuit configurations in FIGS. 2A and 2B are examples; the pixel circuit may have a different circuit configuration. Although the pixel circuits in FIGS. 2A and 2B include p-channel TFTs, the pixel circuit may employ n-channel TFTs.

Image Retention

The substrate of a traditional flexible OLED display device has a structure in which a silicon oxide layer, a silicon nitride layer, and another silicon oxide layer are stuck one above another on a polyimide film having a thickness of 10 um to 15 um. A thin-film transistor (TFT) array is fabricated on the substrate.

Figure 3:
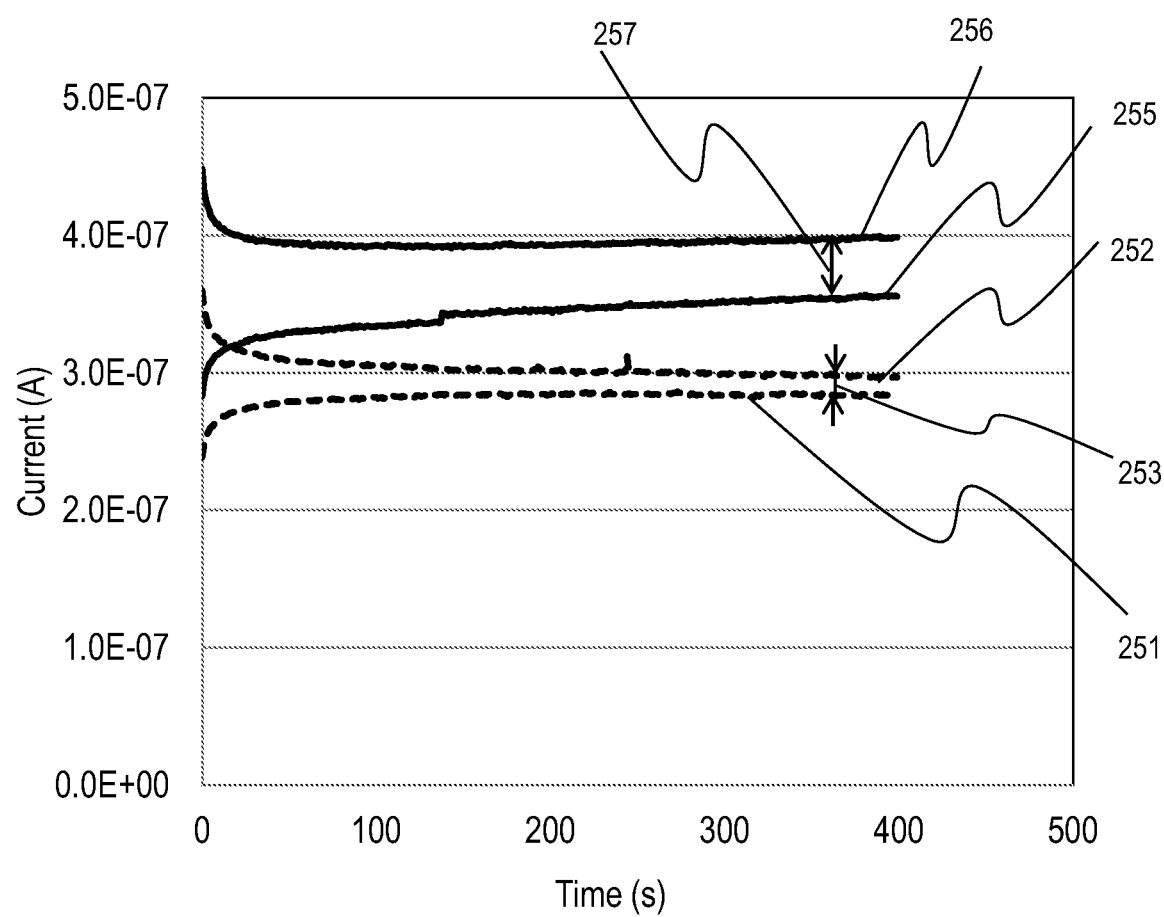
FIG. 3 provides results of comparative evaluation of a characteristic of a TFT on a traditional flexible substrate and a TFT on a glass substrate.

Flexible OLED display devices employing a polyimide film for a substrate exhibit strong image retention (reversable ghost images), compared to OLED display devices employing a glass substrate. FIG. 3 provides results of comparative evaluation of a characteristic of a TFT on a traditional flexible substrate and a TFT on a glass substrate.

In the graph of FIG. 3, the line 251 represents the temporal variation of the driving current when a TFT on a glass substrate is supplied with a data signal to display gray, subsequent to a data signal to display white. The line 252 represents the temporal variation of the driving current when the TFT on the glass substrate is supplied with a data signal to display gray, subsequent to a data signal to display black.

A driving current exhibits a transient response (overshoot) to an abrupt change of the signal. Specifically, when the display is changed from white to gray, the driving current drops to the value a little lower than the target value and gradually increases toward the target value with time as indicated by the line 251. When the display is changed from black to gray, the driving current elevates to a value a little higher than the target value and gradually decreases toward the target value with time as indicated by the line 252. If the difference in current value between the lines 251 and 252 converges to the same value in a short time, no ghost is observed. However, the actual driving currents 251 and 252 take time to converge to the same value; the difference 253 causes a ghost.

Further in the graph of FIG. 3, the line 255 represents the temporal variation of the driving current when a TFT on a flexible (polyimide) substrate is supplied with a data signal to display gray, subsequent to a data signal to display white. The line 256 represents the temporal variation of the driving current when the TFT on the flexible substrate is supplied with a data signal to display gray, subsequent to a data signal to display black. The difference 257 between the driving currents 255 and 256 causes a ghost.

According to the results of comparative evaluation of the characteristic of a TFT on a traditional flexible substrate and a TFT on a glass substrate, the driving currents 251 and 252 flowing through a TFT on the glass substrate exhibit almost symmetrical transient responses in the direction of the temporal axis. However, the driving currents 255 and 256 flowing through a TFT on the flexible substrate are not symmetric. That is to say, when the TFT on the flexible substrate is driven, drift of current occurs, which is not observed with the TFT on the glass substrate. The inventors found that the drift caused by a bias kept being applied to the TFT is superimposed on the symmetric transient response characteristic originally owned by the TFT and as a result, the image retention is unfavorably increased.

As described above, the currents flowing through the TFTs on the flexible substrate are instable to increase the image retention. Since the TFTs on the glass substrate do not show such instability, it is reasonable to consider that this instability is caused by the electric bias stress from the polyimide film when the TFTs are driven. That is to say, an electric field from the polyimide film reaches the channels of the TFTs to change the characteristic of the TFTs. This is the major cause of the increase in image retention.

Accordingly, in order for the polyimide film not to affect the TFTs being driven, providing an electrostatic shield to isolate the TFTs from the polyimide film is effective.

In the following, a structure of a flexible OLED display device that blocks the electric field from the polyimide film toward the channels of the TFTs with an electrostatic shield is described. Further, a method (process conditions) of manufacturing an OLED display device having the structure is described.

Structure of OLED Display Device

Figure 4:
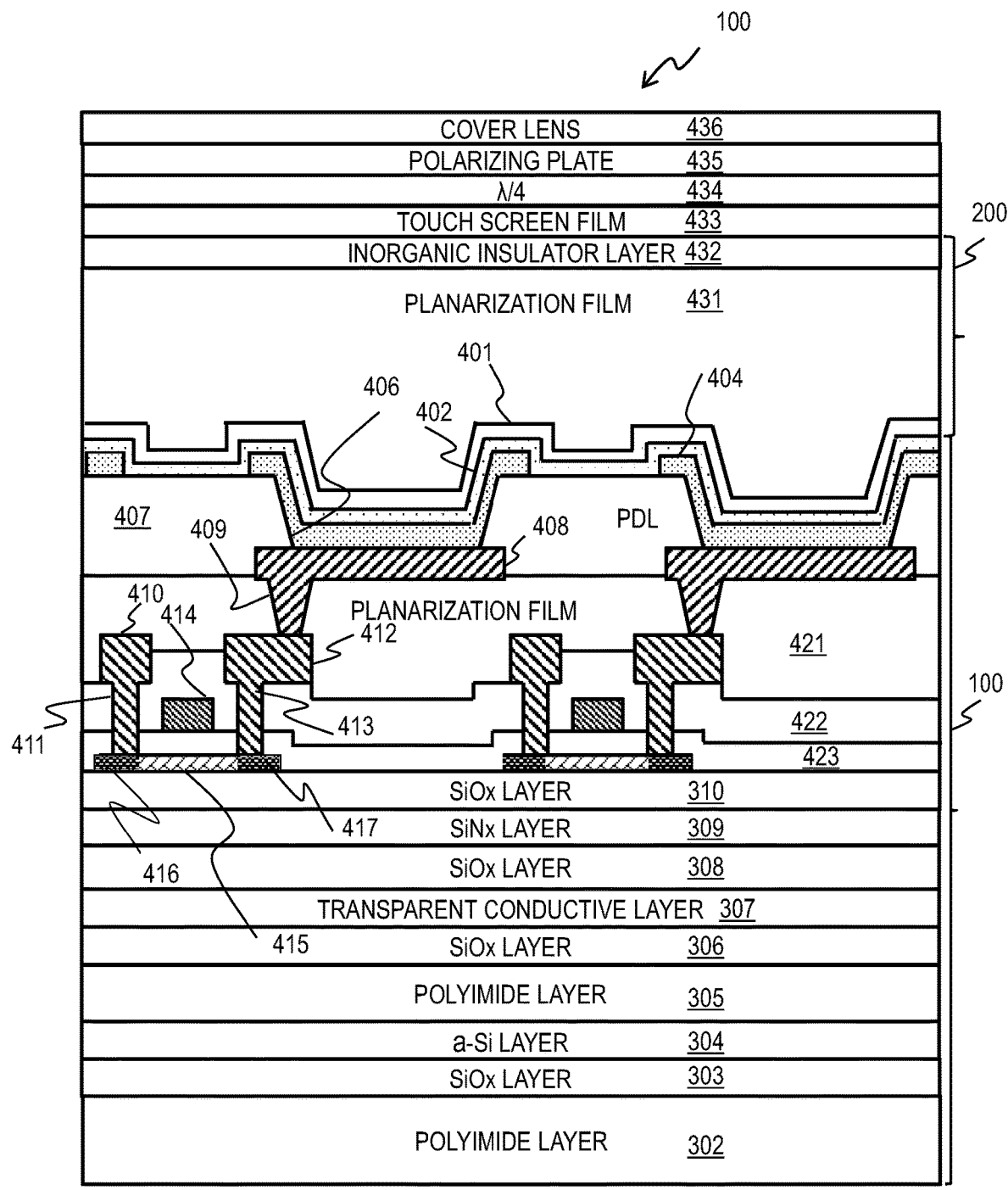
FIG. 4 schematically illustrates a cross-sectional structure of a flexible substrate, driving TFTs, and OLED elements of a TFT substrate and an encapsulation structural unit.

Hereinafter, a structure of an OLED display device is described. Particularly, a general structure of a pixel circuit and a light-emitting element is described. FIG. 4 schematically illustrates a cross-sectional structure of the flexible substrate, driving TFTs, and OLED elements of the TFT substrate 100 and the structural encapsulation unit 200. In the following description, the definitions of top and bottom correspond to the top and the bottom of the drawings.

The OLED display device includes a TFT substrate 100 and a structural encapsulation unit 200. The TFT substrate 100 includes a flexible substrate, and pixel circuits (a TFT array) and OLED elements fabricated on the flexible substrate. The pixel circuits and the OLED elements are provided between the flexible substrate and the structural encapsulation unit 200.

The flexible substrate includes a polyimide layer (first polyimide layer) 302, a silicon oxide layer (first silicon oxide (SiOx) layer) 303, amorphous silicon (a-Si) layer 304, another polyimide layer (second polyimide layer) 305 laid in this order from the bottom. The silicon oxide layer 303 is provided above and in direct contact with the polyimide layer 302. The amorphous silicon layer 304 is provided above and in direct contact with the silicon oxide layer 303. The polyimide layer 305 is provided above and in direct contact with the amorphous silicon layer 304.

The flexible substrate further includes a silicon oxide layer (second silicon oxide layer) 306, a transparent conductive layer 307, another silicon oxide layer (third silicon oxide layer) 308, a silicon nitride (SiNx) layer 309, and still another silicon oxide layer (fourth silicon oxide layer) 310 laid in this order from the lower side, on the aforementioned polyimide layer 305.

Pixel circuits (a TFT array) and OLED elements are provided on the silicon oxide layer 310. The above-described structure of a flexible substrate that includes a plurality of polyimide layers 302 and 305 provides a base layer to produce polysilicon having satisfactory characteristics, as will be described later.

It is known that a polyimide layer contains moisture and this moisture damages the TFT characteristics if it diffuses into the layer mounting the TFTs. The lower polyimide layer 302 reduces the moisture contained in the upper polyimide layer 305 to save the TFT characteristics from being damaged. An example of the lower polyimide layer 302 is thicker than the upper polyimide layer 305. This configuration allows the upper polyimide layer 305 to contain a smaller amount of moisture, achieving less effect of the moisture on the TFT array.

For a flexible layered film composed of multiple films like the one in this embodiment, it is very important to consider the adhesion of the films. Unless considering the adhesion, detachment of the films may occur during the manufacturing process. This also impairs the tolerance to bending.

The silicon oxide layer 303 and the amorphous silicon layer 304 enhance the adhesion of two polyimide layers 302 and 305. The silicon oxide layer 303 has high adhesiveness to the polyimide layer 302 thereunder and the amorphous silicon layer 304 has high adhesiveness to the silicon oxide layer 303 thereunder and the polyimide layer 305 thereabove. The silicon oxide layer 303 and the amorphous silicon layer 304 prevent the upper polyimide layer 305 from detaching from the lower polyimide layer 302.

A transparent conductive layer 307 is provided between the polyimide layer 305 and the pixel circuits. From the points of view of the adhesion of films and the tolerance to bending, the thickness of the transparent conductive layer 307 is not more than 50 nm, for example. The transparent conductive layer 307 reduces the effect of the electric field generated by the charges in the polyimide layer 305 or 302 on the TFTs in the pixel circuits. Because of its transparency, the transparent conductive layer 307 does not affect mask alignment in the manufacturing process, which will be described later. The transparent conductive layer 307 is formed to cover the entire surface of the polyimide layer 305. This configuration effectively diminishes the electric field from the polyimide layer 305 and further, does not require patterning in the manufacturing process, as will be described later.

Although this embodiment employs a transparent conductive layer 307 between the polyimide layer 305 and the pixel circuits, this transparent conductive layer 307 does not need to be perfectly transparent. It can be a conductive film such that reflection therefrom will not affect mask alignment. For example, a thin amorphous silicon film is sufficiently applicable because it has a conductivity enough to provide shield effect but the reflection therefrom is weak enough not to affect the mask alignment and further, it has sufficient adhesiveness to an insulating film.

The transparent conductive layer 307 is supplied with the ground potential or is in an electrically floating state. The ground potential from the transparent conductive layer 307 effectively reduces the effect of the electric field generated between the TFTs and the polyimide film. Even in the electrically floating state, the transparent conductive layer 307 has a sufficiently large capacitance because of its overwhelmingly large area compared to the element area of the TFTs and therefore, it has a shield effect as strong as when it is supplied with the ground potential. The transparent conductive layer 307 in this example contributes to a simple structure of an OLED display device.

The transparent conductive layer 307 can be made of an amorphous oxide such as ITO or IZO. ITO effectively reduces the electric field generated by the charges in polyimide because of its high conductivity (low resistivity). IZO increases the tolerance to bending of the OLED display device.

The silicon oxide layer 306 is located between the polyimide layer 305 and the transparent conductive layer 307 and is in direct contact with them. The silicon oxide layer 306 covers the entire surface of the polyimide layer 305. The silicon oxide layer 306 enhances the adhesion of the transparent conductive layer 307 to the polyimide layer 305.

The silicon oxide layer 308 is located above and in direct contact with the transparent conductive layer 307. The silicon oxide layer 308 increases the adhesion of the transparent conductive layer 307 to the silicon nitride layer 309 and also works as a barrier layer for the OLED elements against moisture or oxygen. The silicon nitride layer 309 is located above and in direct contact with the silicon oxide layer 308. The silicon nitride layer 309 also works as a barrier layer, so that the intrusion of moisture from the polyimide layer 305 to the layer of OLED elements is effectively prevented.

The silicon oxide layer 310 is located above and in direct contact with the silicon nitride layer 309. The silicon oxide layer 310 enables the polysilicon to be prepared next to have satisfactory characteristics. As described above, the lower silicon oxide layer 308 is a barrier layer against moisture and oxygen and is thicker than the upper silicon oxide layer 310.

OLED elements are provided on the flexible substrate including the above-described plurality of layers. An OLED element includes a lower electrode (for example, an anode electrode 408), an upper electrode (for example, a cathode electrode 402), and a multilayer organic light-emitting film 404. The multilayer organic light-emitting film 404 is located between the cathode electrode 402 and the anode electrode 408. A plurality of anode electrodes 408 are disposed on the same plane (for example, on a planarization film 421); one multilayer organic light-emitting film 404 is disposed above one anode electrode 408. In the example of FIG. 4, the cathode electrode 402 of one subpixel is a part of an unseparated conductor film.

Illustrated in FIG. 4 is an example of a top-emission pixel structure, which includes top-emission type of OLED elements. The top-emission pixel structure is configured in such a manner that a cathode electrode 402 common to a plurality of pixels is provided on the light emission side (the upper side of the drawing). The cathode electrode 402 has a shape that fully covers the entire display region 125. The top-emission pixel structure is characterized by that the anode electrodes 408 have light reflectivity and the cathode electrode 402 has light transmissivity. Hence, a configuration to transmit light coming from the multilayer organic light-emitting films 404 toward the structural encapsulation unit 200 is attained.

Compared to a bottom-emission pixel structure configured to extract light toward the polyimide layer, the top-emission type does not need a light transmissive region within a pixel region to extract light. For this reason, the top-emission type has high flexibility in laying out pixel circuits. For example, the light-emitting elements can be provided above the pixel circuits or lines.

The bottom-emission pixel structure has a transparent anode electrode and a reflective cathode electrode to emit light to the external through the flexible substrate. If both the anode electrode and the cathode electrode are made of light transmissive materials, a transparent display device can be obtained. The structure of the flexible substrate of this disclosure is applicable to OLED display devices of any of these types and further, display devices including light-emitting elements other than OLEDs.

A subpixel of a full-color OLED display device usually displays one of the colors of red, green, and blue. A red subpixel, a green subpixel, and a blue subpixel constitute one main pixel. A pixel circuit including a plurality of thin-film transistors controls light emission of an OLED element associated therewith. An OLED element is composed of an anode electrode as a lower electrode, an organic light-emitting film, and a cathode electrode as an upper electrode.

An OLED display device includes a plurality of pixel circuits (a TFT array). Each of the pixel circuits includes a plurality of switches and is formed between the silicon oxide layer 310 and an anode electrode 408 to control the electric current to be supplied to the anode electrode 408. The driving TFTs in FIG. 4 have a top-gate structure. The other TFTs also have the top-gate structure.

A polysilicon layer is provided above and in direct contact with the silicon oxide layer 310. The polysilicon layer includes channels 415 at the locations where gate electrodes 414 are to be formed later. The characteristics of a TFT is determined by the channel 415. At both ends of each channel 415, source/drain regions 416 and 417 are provided. The source/drain regions 416 and 417 are doped with high-concentration impurities for electrical connection with a wiring layer thereabove.

Lightly doped drains (LDDs) doped with low-concentration impurities can be provided between the channel 415 and the source/drain region 416 and between the channel 415 and the source/drain region 417. FIG. 4 omits the LDDs to avoid complexity. Above the polysilicon layer, gate electrodes 414 are provided with a gate insulating film 423 interposed therebetween. An interlayer insulating film 422 is provided above the layer of the gate electrodes 414.

Within the display region 125, source/drain electrodes 410 and 412 are provided above the interlayer insulating film 422. The source/drain electrodes 410 and 412 are formed of a metal having a high melting point or an alloy of such a metal. Each source/drain electrode 410 and each source/drain electrode 412 are connected with a source/drain region 416 and a source/drain region 417 of the polysilicon layer through contact holes 411 and 413 provided in the interlayer insulating film 422 and the gate insulating film 423.

Over the source/drain electrodes 410 and 412, an insulative organic planarization film 421 is provided. Above the planarization film 421, anode electrodes 408 are provided. Each anode electrode 408 is connected with a source/drain electrode 412 through a contact hole 409 in the planarization film 421. The TFTs of a pixel circuit are formed below the anode electrode 408.

An anode electrode 408 can be composed of a reflective metal layer in the middle and transparent conductive layers sandwiching the reflective metal layer. The anode electrode 408 can have an ITO/Ag/ITO structure or an IZO/Ag/IZO structure. Although IZO has a resistance higher than ITO, IZO increases the tolerance to bending of the OLED display device.

Above the anode electrodes 408, an insulative pixel defining layer (PDL) 407 is provided to separate OLED elements. OLED elements are formed in openings 406 of the pixel defining layer 407.

Above each anode electrode 408, a multilayer organic light-emitting film 404 is provided. The multilayer organic light-emitting film 404 is in contact with the pixel defining layer 407 in the opening 406 of the pixel defining layer 407 and its periphery. Each multilayer organic light-emitting film 404 is formed by depositing organic light-emitting material for the color of R, G, or B on an anode electrode 408.

A multilayer organic light-emitting film 404 is formed by vapor deposition of organic light-emitting material in the region corresponding to a pixel through a metal mask. A multilayer organic light-emitting film 404 consists of, for example, a hole injection layer, a hole transport layer, a light-emitting layer, an electron transport layer, and an electron injection layer in this order from the bottom. The layered structure of the multilayer organic light-emitting film 404 is determined depending on the design.

A cathode electrode 402 is provided over the multilayer organic light-emitting film 404. The cathode electrode 402 is a light-transmissive electrode. The cathode electrode 402 transmits part of the visible light coming from the multilayer organic light-emitting film 404. The layer of the cathode electrode 402 is formed by vapor-deposition of a metal such as Al or Mg or an alloy thereof, for example. If the resistance of the cathode electrode 402 is so high to impair the uniformity of the luminance of the emitted light, an additional auxiliary electrode layer may be formed using a material for a transparent electrode, such as ITO, IZO, ZnO, or $In_2O_3$.

The stack of the anode electrode 408, the multilayer organic light-emitting film 404, and the cathode electrode 402 formed in an opening 406 of the pixel defining layer 407 corresponds to an OLED element. A structural encapsulation unit 200 is provided above and in direct contact with the cathode electrode 402. The structural encapsulation unit (thin-film encapsulation unit) 200 includes an inorganic insulator (for example, SiNx or AlOx) layer 401, an organic planarization film 431, and another inorganic insulator (for example, SiNx or AlOx) layer 432. The inorganic insulator layers 401 and 432 are a lower passivation layer and an upper passivation layer for enhancing the reliability.

A touch screen film 433, a λ/4 plate 434, a polarizing plate 435, and a resin cover lens 436 are laid in this order toward the top, on the structural encapsulation unit 200. The λ/4 plate 434 and the polarizing plate 435 are to reduce the reflection of the light coming from the external. The layered structure of the OLED display device described with reference to FIG. 4 is an example; one or more of the layers in FIG. 4 may be omitted and one or more layers not shown in FIG. 4 may be added.

Manufacturing Method

Figure 5A:
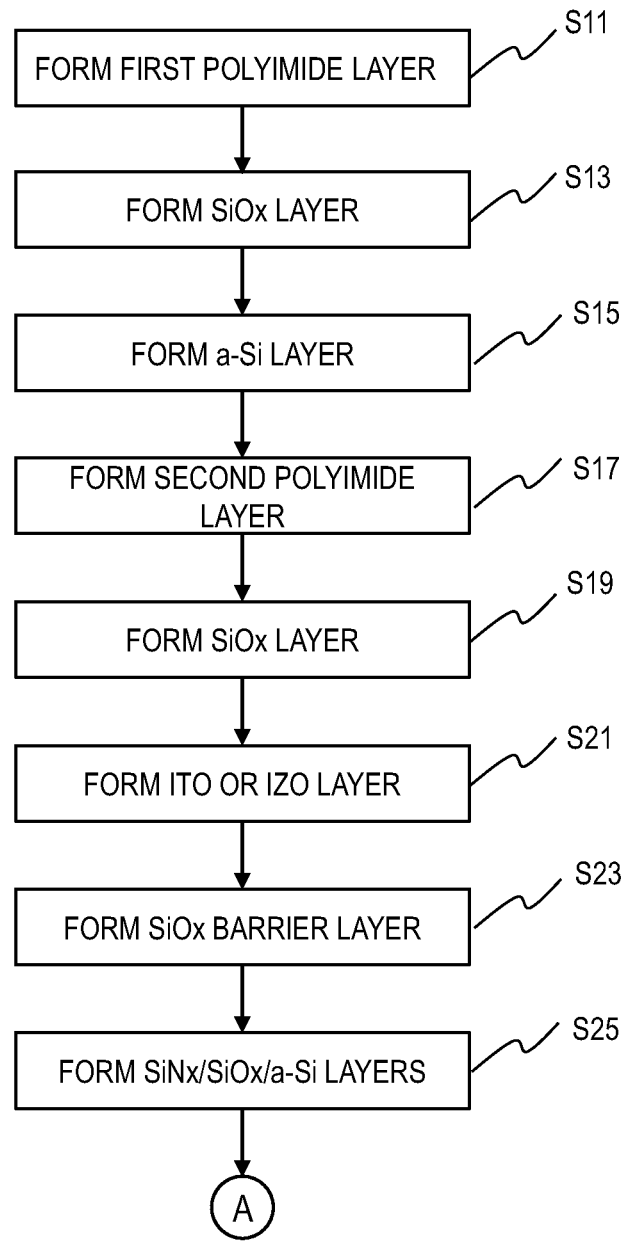
FIG. 5A and FIG. 5B illustrate a manufacturing process of a backplane in an example of a method of manufacturing an OLED display device.
Figure 5B:
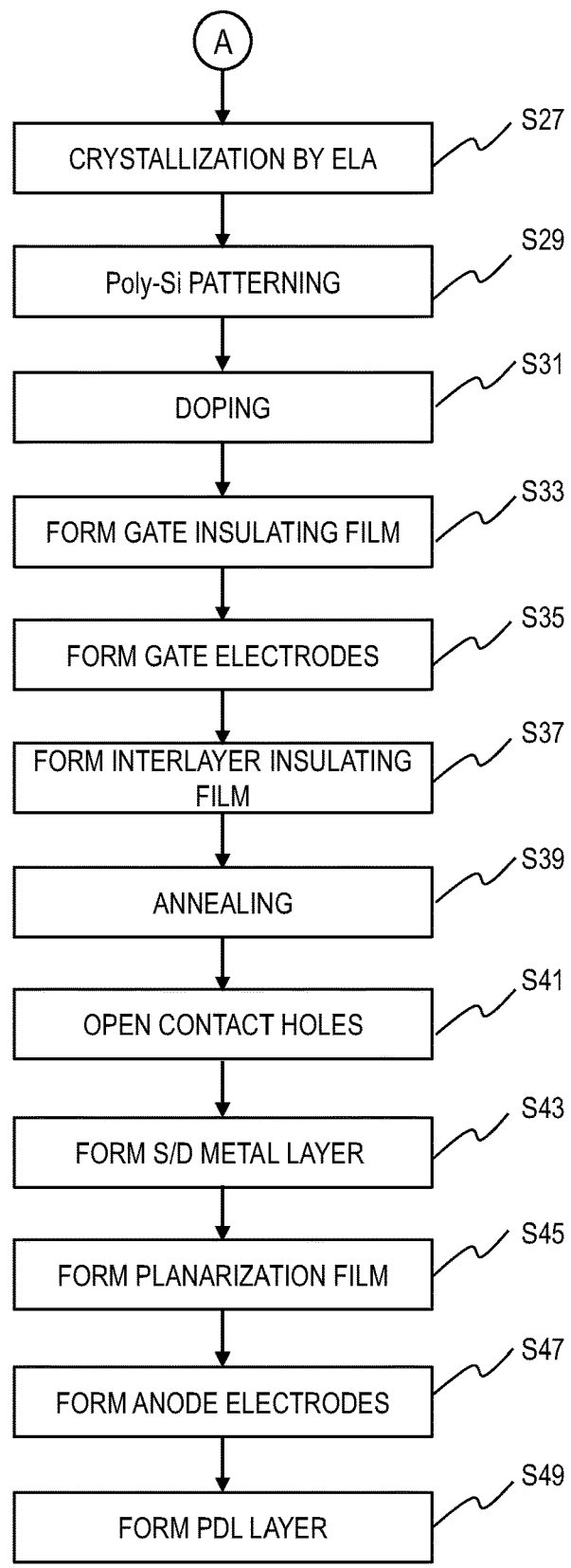

Next, an example of a method of manufacturing an OLED display device is described. FIGS. 5A and 5B illustrate a manufacturing process of a backplane in an example of a method of manufacturing an OLED display device. The following description is to explain the features of this embodiment; a part of the actual process to manufacture an OLED display device are omitted.

As illustrated in FIG. 5A, the method of manufacturing an OLED display device first forms a polyimide layer (first polyimide layer) 302 on a not-shown glass substrate (insulative support substrate) by application and heat treatment (S11). The polyimide layer 302 has a thickness enough to provide a required strength to the flexible substrate.

Next, the method deposits silicon oxide on the polyimide layer 302 by chemical vapor deposition (CVD) to form a silicon oxide layer 303 (S13). Next, the method deposits amorphous silicon on the silicon oxide layer 303 by CVD to form an amorphous silicon layer 304 (S15).

As described above, the silicon oxide layer 303 is an adhesion enhancement layer for the polyimide layer 302 and the amorphous silicon layer 304 is an adhesion enhancement layer for the polyimide layer (second polyimide layer) 305. These layers prevent the polyimide layer 305 from detaching from the polyimide layer 302.

Next, the method forms a polyimide layer 305 on the amorphous silicon layer 304 by application and heat treatment (S17). As described above, the polyimide layer 305 is formed thinner than the lower polyimide layer 302 to prevent the electric field caused by the moisture in the polyimide layer 305 from affecting the characteristics of the TFTs. Next, the method forms a silicon oxide layer 306 on the polyimide layer 305 by CVD (S19). As described above, the silicon oxide layer 306 enhances the adhesion of the transparent conductive layer 307 thereabove to the polyimide layer 305.

Next, the method deposits a transparent conductor on the silicon oxide layer 306 by sputtering to form a transparent conductive layer 307 (S21). The transparent conductive layer 307 can be a metallic oxide thin film such as an ITO layer or an IZO layer, or a semiconductor film such as an amorphous silicon film formed by CVD.

Generally, an amorphous silicon thin film is not suitable for a conductive wiring layer because of its high electric resistance. However, this resistance is low enough to be used as a shield layer. Experiments by the inventors revealed that an amorphous silicon layer having a thickness of not less than 10 Å can shield TFTs from the effect of the charges in the polyimide layers 305 and 302. Further, the experiments revealed that an amorphous silicon layer having a thickness of not more than 50 Å has sufficient transmittance, like a metallic thin film.

In still another example, a flexible substrate in which amorphous silicon layers inclusive of the amorphous silicon layer 304 have a total thickness not more than 50 Å is applicable to the devices that utilize transmitted light such as transparent display devices and under-panel cameras. Unlike a reflective metallic layer, the transparent conductive layer 307 does not need to be patterned because of its transparency; it does not to affect the mask alignment in the subsequent processes.

Further, not patterning the transparent conductive layer means that the entire substrate is covered with the conductive layer from the underside of the TFT elements. Accordingly, the transparent conductive layer 307 shows the same effect as the ground electrode to the static electricity generated in the course of TFT fabrication, which contributes to reduction of the defects caused by the static electricity or the variations of the characteristics caused by the static electricity.

Even after the formation of the cathode electrode, the transparent conductive layer 307 exhibits an effect equivalent to shielding the entire panel module from static electricity because it is covering the entire module with an area larger than the area of the cathode electrode from the underside of the TFT element circuit. For example, the mounting terminal of the driver IC including an anisotropic conductive film is likely to suffer from static electricity because it is located outside the region of the cathode electrode. However, this structure covering the entire terminal with a floating conductive film achieves less effect of static electricity in the mounting process.

Next, the method deposits silicon oxide on the transparent conductive layer 307 by CVD to form a silicon oxide layer 308 (S23). The silicon oxide layer 308 is a barrier layer against moisture or oxygen. From the standpoint for better throughput, the silicon oxide layer 308 is formed to have a thickness to appropriately function as a barrier layer, which is thicker than the silicon oxide layer 310 to be formed thereabove.

Next, the method successively forms a silicon nitride layer 309, a silicon oxide layer 310, and an amorphous silicon layer on the silicon oxide layer 308 by CVD under the conditions to attain better film quality (S25). These three layers are formed at a deposition rate lower than that for the silicon oxide layer 308 to attain satisfactory film quality. Further, the method heats the amorphous silicon layer to dehydrogenate it. Although this heating treatment is usually performed in air at a temperature higher than 400° C., the heating treatment in this embodiment is performed in an atmosphere of an inert gas (such as nitrogen gas) at a temperature lower than 400° C. As a result, the transparent conductive layer 307 formed before TFTs can avoid deterioration of its film quality because of its crystallization, while assuring satisfactory TFT characteristics.

Through the foregoing steps, a flexible substrate is prepared. The steps described with reference to FIG. 5A are completed without patterning any layer.

Subsequently, as illustrated in FIG. 5B, the method forms a polysilicon film by crystalizing the amorphous silicon by excimer laser annealing (ELA) (S27) and patterns the polysilicon layer (S29). The ELA is performed under the conditions that the TFTs will attain uniform characteristics (with considerably lower energy than the energy to attain the maximum mobility).

Next, the method dopes the source/drain regions 416 and 417 to be connected with source/drain electrodes 410 and 412 with impurities in high concentration to reduce the resistance (S31). The polysilicon layer reduced in resistance can also be used to connect elements within the display region 125.

Next, the method deposits silicon oxide, for example, onto the polysilicon layer including the channels 415 by CVD to form a gate insulating film 423 (S33). Furthermore, the method deposits metal by sputtering and patterns the metal to form a metal layer including gate electrodes 414 (S35). The metal layer includes storage capacitor electrodes, scanning lines 106, and emission control lines 107, in addition to the gate electrodes 414.

The metal layer may be a single layer made of one substance selected from a group consisting of Mo, W, Nb, MoW, MoNb, Al, Nd, Ti, Cu, a Cu alloy, an Al alloy, Ag, and an Ag alloy. Alternatively, the metal layer may have a multilayer structure including two or more layers to reduce the wiring resistance. Each layer can be made of a low-resistive material selected from a group consisting of Mo, Cu, Al, and Ag.

Next, the method deposits silicon nitride by CVD to form an interlayer insulating film 422 (S37). Next, the method performs annealing to activate and hydrogenate the polysilicon layer (S39). The hydrogenation uses the hydrogen in the interlayer insulating film 422 made of silicon nitride. This annealing is performed in the atmosphere of an inert gas (such as nitrogen gas) at a temperature lower than 400° C. As a result, the transparent conductive layer 307 can be prevented from crystallizing to attain satisfactory TFT characteristics. This annealing step S39 can be performed after the next contact hole opening step S41.

Next, the method opens contact holes in the interlayer insulating film 422 and the gate insulating film 423 by anisotropic etching (S41). The contact holes 411 and 413 for connecting the source/drain electrodes 410 and 412 to the source/drain regions 416 and 417 are formed in the interlayer insulating film 422 and the gate insulating film 423.

Next, the method deposits conductive films of Ti/Al/Ti, for example, by sputtering and patterns the films to form a metal layer (S43). The metal layer includes source/drain electrodes 410 and 412 and inner coating or filling of the contact holes 411 and 413. In addition to these, data lines 105 and power lines 108 are also formed in the same layer.

Next, the method deposits a photosensitive organic material to form a planarization film 421 (S45). Subsequently, the method opens contact holes 409 for connecting the source/drain electrodes 412 of the TFTs to the anode electrodes 408 by exposure and development.

The method forms anode electrodes 408 on the planarization film 421 having contact holes 409 (S47). An anode electrode 408 includes three layers of a transparent conductive layer made of ITO, IZO, ZnO, $In_2O_3$, or the like, a reflective layer made of a metal such as Ag, Mg, Al, Pt, Pd, Au, Ni, Nd, Ir, or Cr or an alloy containing such a metal, and another transparent conductive layer as mentioned above. An IZO transparent conductive layer can increase the tolerance of bending of the OLED display device. The three-layer structure of the anode electrode 408 is merely an example and the anode electrode 408 may have a two-layer structure. The anode electrodes 408 are connected to the source/drain electrodes 412 through the contact holes 409.

Next, the method deposits a photosensitive organic resin by spin coating and patterns the photosensitive organic resin to form a pixel defining layer 407 (S49). The patterning creates openings 406 in the pixel defining layer 407 to expose the anode electrodes 408 of the subpixels at the bottom of the created openings 406. The pixel defining layer 407 forms separate light-emitting regions of subpixels.

Through the foregoing processes, a flexible substrate and pixel circuits (a TFT array) on the flexible substrate are prepared. The process after forming the pixel defining layer 407 can be performed with existing techniques and therefore, explanation thereof is omitted here.

In manufacturing an OLED display device, the temperature reaches the highest point at S25 of heating and dehydrogenating an amorphous silicon layer or S39 of hydrogenating and activating a polysilicon layer. Accordingly, if these processes are performed at temperatures lower than 400° C., all processes in manufacturing an OLED display device are performed at temperatures lower than 400° C. In addition to the above-described processes, processes to form storage capacitors can be included by adding formation of a metal layer and an interlayer insulating film.

As described above, the OLED display device in this embodiment includes a transparent conductive layer between the polyimide layer and the TFT array (pixel circuits). This transparent conductive layer 307 reduces the effect of the electric field generated by the charges included in the polyimide layer onto the TFTs to stabilize the operation of the TFTs and achieve low image retention. Furthermore, disposing the transparent conductive layer lower than the TFT array makes it easy to bring a neutral plane to the TFT layer. The neutral plane means a virtual plane in the cross-section of a flexible layered structure that is not stressed when the flexible layered structure is bent.

Figure 6A:
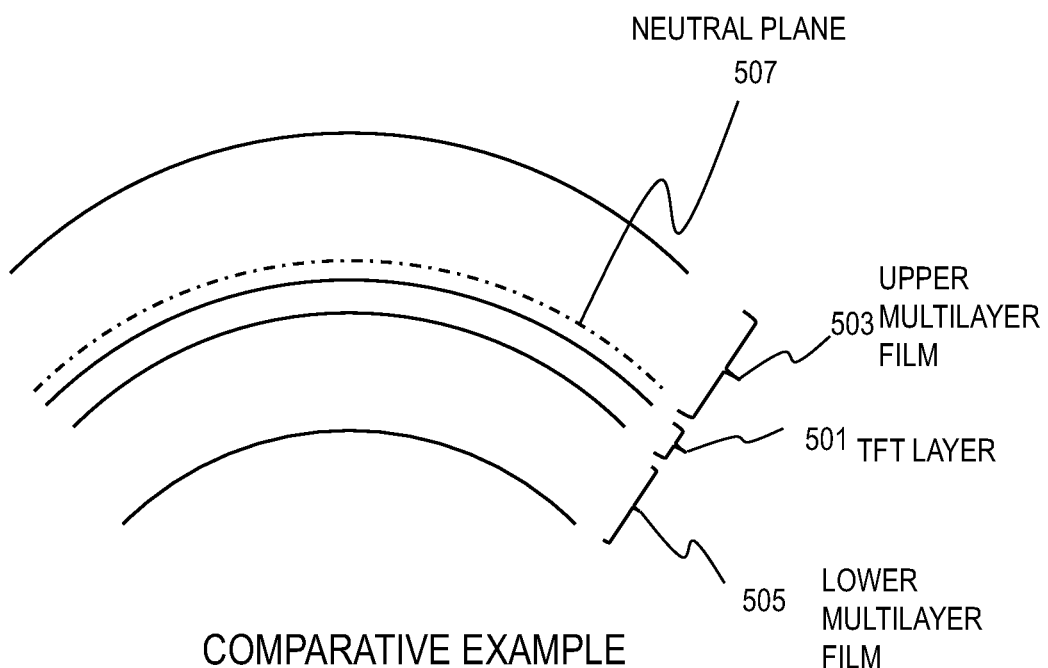
FIG. 6A schematically illustrates a cross-section of an OLED display device of a comparative example.

FIG. 6A schematically illustrates a cross-section of an OLED display device of a comparative example. The TFT layer 501 is sandwiched by an upper multilayer film 503 and a lower multilayer film 505. Since most functional layers of a flexible OLED display device are included in the upper multilayer film 503, the neutral plane 507 is located in the upper multilayer film 503 upper than the TFT layer 501.

Figure 6B:
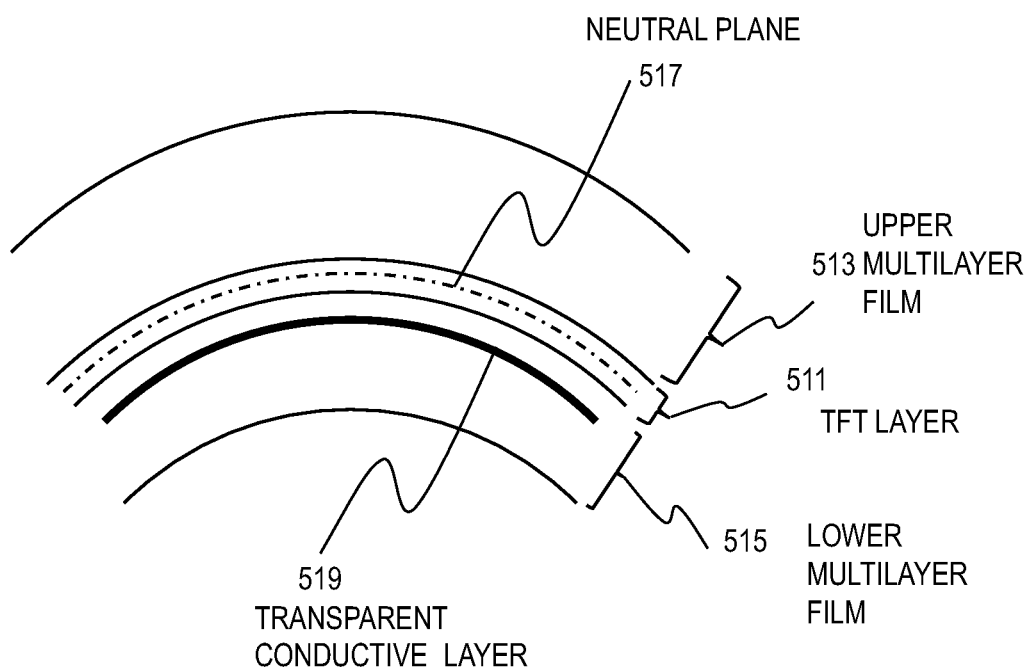
FIG. 6B schematically illustrates a cross-section of an OLED display device including a transparent conductive layer of an embodiment of this disclosure.

FIG. 6B schematically illustrates a cross-section of an OLED display device including a transparent conductive layer 519 in this embodiment. The TFT layer 511 is sandwiched by an upper multilayer film 513 and a lower multilayer film 515. The transparent conductive layer 519 is included in the lower multilayer film 515. Since the transparent conductive layer 519 is located lower than the TFT layer 511, the neutral plane 517 can be easily brought to the TFT layer 511. Accordingly, the OLED display device can have more reliability against bend.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a first polyimide layer;
   a first silicon oxide layer located above and in direct contact with the first polyimide layer;
   an amorphous silicon layer located above and in direct contact with the first silicon oxide layer;
   a second polyimide layer located above and in direct contact with the amorphous silicon layer;
   a plurality of light-emitting elements located above the second polyimide layer;
   a transistor array located above the second polyimide layer, the transistor array being configured to control light emission of the plurality of light-emitting elements;
   a transparent conductive layer located between the transistor array and the second polyimide layer;
   a second silicon oxide layer located between and in direct contact with the transparent conductive layer and the second polyimide layer;
   a polysilicon layer of the transistor array;
   a third silicon oxide layer located between the polysilicon layer and the transparent conductive layer;
   a silicon nitride layer located between the polysilicon layer and the third silicon oxide layer; and
   a fourth silicon oxide layer located between the polysilicon layer and the silicon nitride layer, the fourth silicon oxide layer being in direct contact with the polysilicon layer.

2. The display device according to claim 1, wherein the second silicon oxide layer and the transparent conductive layer is covering the entire surface of the second polyimide layer.

3. The display device according to claim 1, wherein the transparent conductive layer is electrically floating.

4. The display device according to claim 1, wherein the transparent conductive layer is an ITO layer or an IZO layer.

5. The display device according to claim 1, wherein the transparent conductive layer is made of amorphous silicon.

6. The display device according to claim 5, wherein the thickness of the transparent conductive layer is not less than 10 Å but not more than 50 Å.

7. The display device according to claim 6, wherein the sum of the thickness of the amorphous silicon layer and the thickness of the transparent conductive layer is not more than 50 Å.

8. The display device according to claim 1, wherein the transistor array includes top-gate polysilicon thin-film transistors.

9. The display device according to claim 1,
   wherein the transparent conductive layer is an IZO layer, and
   wherein anode electrodes of the plurality of light-emitting elements include two IZO layers and a reflective metal layer between the two IZO layers.

10. The display device according to claim 1, wherein the second polyimide layer is thinner than the first polyimide layer.

* * * * *